(12) United States Patent
Urakawa et al.

(10) Patent No.: US 8,208,325 B2
(45) Date of Patent: Jun. 26, 2012

(54) SEMICONDUCTOR DEVICE, SEMICONDUCTOR PACKAGE AND MEMORY REPAIR METHOD

(75) Inventors: Yukihiro Urakawa, Kanagawa (JP); Naoki Kiryu, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 243 days.

(21) Appl. No.: 12/694,475

(22) Filed: Jan. 27, 2010

(65) Prior Publication Data

US 2010/0195425 A1 Aug. 5, 2010

(30) Foreign Application Priority Data

Feb. 4, 2009 (JP) .................................... 2009-24310

(51) Int. Cl.
*G11C 29/00* (2006.01)
(52) U.S. Cl. ........................... 365/200; 365/201; 365/51
(58) Field of Classification Search .................. 365/200, 365/201, 51
See application file for complete search history.

(56) References Cited

U.S. PATENT DOCUMENTS

| 6,925,018 B2* | 8/2005 | Tatsumi ........................ 365/201 |
| 7,053,470 B1* | 5/2006 | Sellers et al. .................. 257/678 |
| 7,313,038 B2* | 12/2007 | Otsuka .......................... 365/201 |
| 7,768,847 B2* | 8/2010 | Ong et al. ..................... 365/200 |

FOREIGN PATENT DOCUMENTS

| JP | 2004-158098 | 6/2004 |
| JP | 2006-186247 | 7/2006 |
| JP | 2009-016020 | 1/2009 |

* cited by examiner

*Primary Examiner* — Alexander Sofocleous
*Assistant Examiner* — Hai Pham
(74) *Attorney, Agent, or Firm* — Sprinkle IP Law Group

(57) ABSTRACT

A semiconductor device includes a BIST circuit configured to detect a defective bit in a DRAM connected to the semiconductor device, and retrieve an address of the detected defective bit, a non-volatile eFuse macro configured to retain the address of the defective bit in the DRAM, the defective bit being detected by the BIST circuit, and a repair register configured to store data for the address of the defective bit. The semiconductor device also includes an address controller configured to, based on the address retained in the eFuse macro, perform control to use the repair register during writing or reading of data to or from the address of the defective bit.

20 Claims, 4 Drawing Sheets

SEMICONDUCTOR DEVICE, SEMICONDUCTOR PACKAGE AND MEMORY REPAIR METHOD

CROSS REFERENCE TO RELATED APPLICATION

This application is based upon and claims the benefit of priority from the prior Japanese Patent Application No. 2009-24310 filed in Japan on Feb. 4, 2009; the entire contents of which are incorporated herein by reference.

BACKGROUND OF THE INVENTION

1. Field of the Invention

The present invention relates to a semiconductor device, a semiconductor package and a memory repair method, and specifically relates to a semiconductor device provided with a repair circuit for repairing a defective bit in a memory inside the device, a semiconductor package and a memory repair method.

2. Description of the Related Art

Conventionally, there are circuits configured to repair defects in a memory. For example, a semiconductor memory device including a fuse circuit, a row redundancy section and an I/O redundancy section in an embedded memory in order to repair a defect in the embedded memory, (for example, see Japanese Patent Application Laid-Open Publication No. 2006-302464).

In recent years, for example, a technique called SiP (System in Package) in which a memory with a large capacity is stacked on a semiconductor chip and enclosed in a single package has been used. Consequently, chips that have conventionally been separated into two packages can be enclosed in a single package, enabling reduction of the mounting area, and thus, enabling, for example, downsizing of mobile phones.

However, where a memory is stacked on a semiconductor chip, it is necessary to properly connect the semiconductor chip and the memory using a technique called micro bumping or bonding, but memory defects occur at a small percentage due to thermal stress during this connection, and thus, it is necessary to perform a test again.

Where a memory is stacked on a semiconductor chip, but the memory connected as a result of being stacked includes no circuit configured to repair a memory defect, a test for repairing the memory defect cannot be performed, and thus, the occurred memory defect cannot be repaired.

Meanwhile, where a memory is stacked on a semiconductor chip, and the memory connected as a result of being stacked includes a circuit configured to repair a memory defect, a test for repairing the memory defect is performed for the memory, obtaining repair information for the memory defect. Subsequently, based on the repair information, blow processing of an eFuse circuit is performed, for example. Furthermore, depending on the repair circuit included in the memory, it is necessary to perform a test for examining whether or not the blow processing of the eFuse circuit has correctly been performed.

As described above, even a memory connected as a result of being stacked including a circuit configured to repair a memory defect has a problem that a large amount of time may be required for this series of processing, increasing the test cost.

BRIEF SUMMARY OF THE INVENTION

An aspect of the present invention enables provision of a semiconductor device including a processor core, the semiconductor device including: a defective bit detection circuit configured to detect a defective bit in a memory connected to the semiconductor device, and retrieve an address of the detected defective bit; a non-volatile defect information retaining circuit configured to retain the address of the defective bit in the memory, the defective bit being detected by the defective bit detection circuit; a defective bit storage circuit configured to store data for the address of the defective bit; and a control section configured to, based on the address retained in the defect information retaining circuit, perform control to use the defective bit storage circuit during reading from and writing to the address of the defective bit.

DETAILED DESCRIPTION OF THE INVENTION

Hereinafter, an embodiment of the present invention will be described in detail with reference to the drawings.

Figure 1:
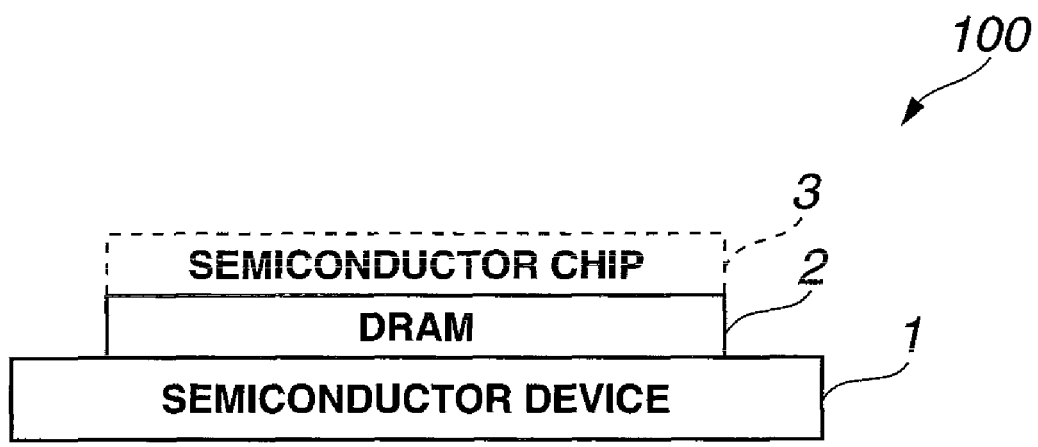
FIG. 1 is a configuration diagram illustrating a configuration of a semiconductor package including a semiconductor device according to an embodiment of the present invention.

First, the configuration of a semiconductor package including a semiconductor device according to an embodiment of the present invention will be described with reference to FIG. 1. FIG. 1 is a configuration diagram illustrating the configuration of a semiconductor package including a semiconductor device according to an embodiment of the present invention.

As illustrated in FIG. 1, the semiconductor device 1 according to the present embodiment is a one-chip semiconductor device including a plurality of function blocks and having a predetermined function. On this semiconductor device 1, a DRAM 2, which is a one-chip memory, is stacked via, for example, micro bumping or bonding. On the DRAM 2, a one-chip semiconductor chip 3 having a predetermined function may further be stacked via, e.g., micro bumping or bonding.

The semiconductor device 1, the DRAM 2 and the semiconductor chip 3 are enclosed in a single semiconductor package 100, as a SiP (System in Package), for example.

The semiconductor device 1 includes a test circuit configured to perform a built-in self-test (hereinafter referred to as "BIST") for the DRAM 2 as described later. The semiconductor device 1 also includes a repair circuit configured to repair a defective bit in the DRAM 2 as described later. Thus, even when the DRAM 2 includes a repair circuit configured to repair a defective bit, the repair circuit is not used. Also, since the semiconductor device 1 includes a repair circuit, even when a DRAM 2 including no repair circuit is stacked on the semiconductor device 1, the semiconductor device 1 can repair a defective bit in the DRAM 2.

Figure 2:
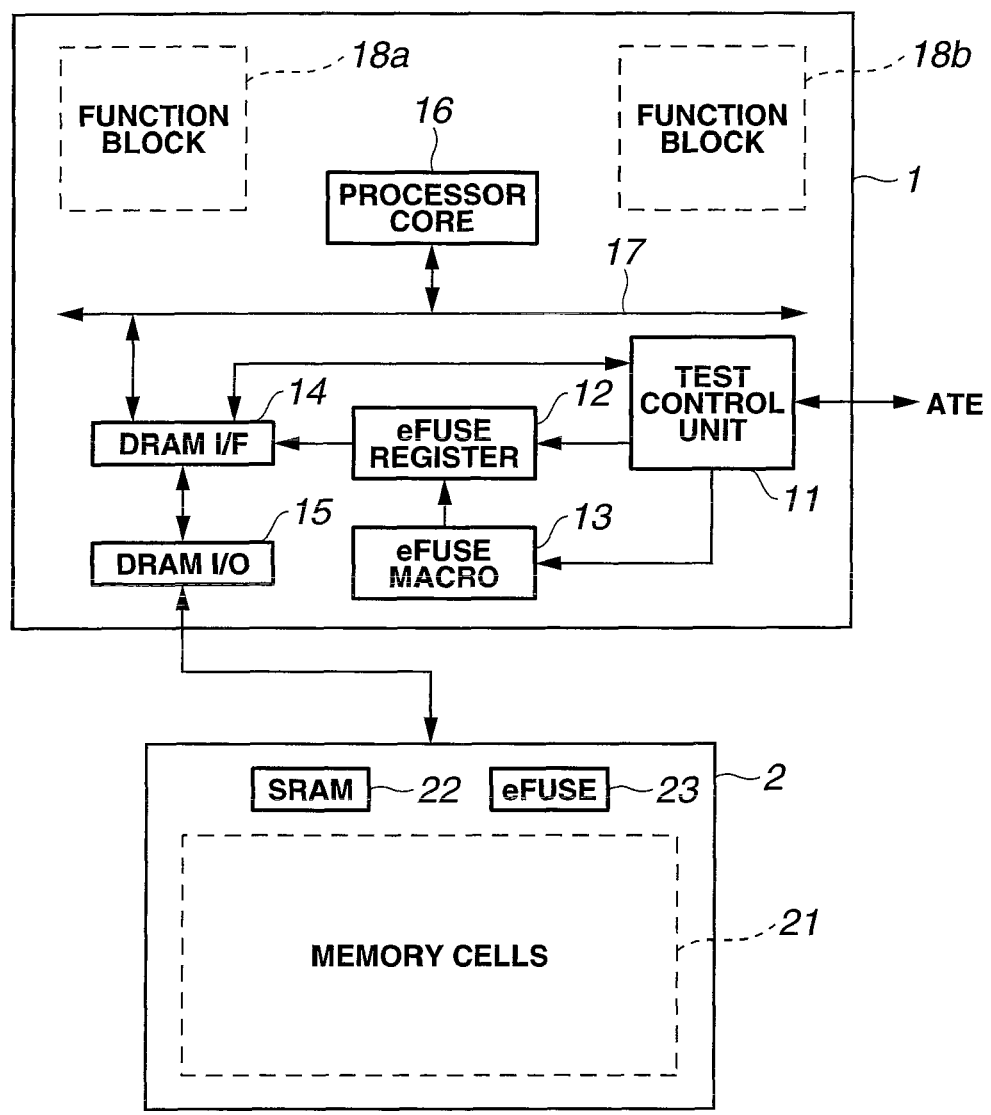
FIG. 2 is a block diagram of a plan view of connection between a semiconductor device 1 and a DRAM 2.

FIG. 2 is a block diagram of a plan view of connection between the semiconductor device 1 and the DRAM 2.

As illustrated in FIG. 2, the semiconductor device 1 includes a test control unit (hereinafter referred to as "TCU") 11, an eFuse register 12, an eFuse macro 13, a DRAM I/F 14, a DRAM I/O 15, a processor core 16, a bus 17, a plurality of, here, two function blocks 18a and 18b.

The DRAM 2 includes memory cells 21, an SRAM 22 and an eFuse 23. The memory cells 21 form a storage area of the DRAM 2. The SRAM 22 and the eFuse 23 form a circuit configured to, when the memory cells 21 having a defect, repair the defect. However, as will be described later, a repair of a defect in the DRAM 2 is performed in the semiconductor device 1, and thus, the SRAM 22 and the eFuse 23 are not used. Although it has been described that the DRAM 2 includes the SRAM 22 and the eFuse 23, as will be described later, a repair of a defect in the DRAM 2 is performed in the semiconductor device 1, and thus, the DRAM 2 need not include the SRAM 22 and the eFuse 23.

During normal mode, the processor core 16 controls writing and reading of data to and from the DRAM 2. When writing data to the DRAM 2, the processor core 16 outputs the data to be written and an address for the data to the DRAM I/F 14 via a bus 17. The DRAM I/F 14 supplies the data and the address to the DRAM 2 via the DRAM I/O 15. Consequently, the data is written in a predetermined address in the DRAM 2.

Also, when reading data from the DRAM 2, the processor core 16 outputs the address of the data to be read to the DRAM I/F 14 via the bus 17. The DRAM I/F 14 supplies the address to the DRAM 2 via the DRAM I/O 15. The DRAM 2 supplies data stored in the supplied address to the DRAM I/F 14 via the DRAM I/O 15. The DRAM I/F 14 outputs the data to the processor core 16 via the bus 17. Consequently, the data is read from a predetermined address in the DRAM 2.

When a test of the DRAM 2 is performed, a control signal for issuing an instruction to perform the test is supplied to the TCU 11 from an external tester (hereinafter referred to as "ATE"). The TCU 11 supplies this control signal to the DRAM I/F 14. The DRAM I/F 14 includes a test circuit configured to perform a self-test of the DRAM 2, which will be described later, and retain address information for a defective bit in the DRAM 2 as the result of the test circuit's performance. The DRAM I/F 14 outputs the defective bit address information to the TCU 11. The TCU 11 blows the eFuse macro 13 to write the defective bit address information to the eFuse macro 13. As described above, the TCU 11 constitutes a processing circuit configured to perform the processing to write defective bit address information to the eFuse macro 13.

The eFuse macro 13 is a non-volatile storage section that can retain the defective bit address information even when power is off. This eFuse macro 13 constitutes a non-volatile defect information retaining circuit configured to retain address information for a defective bit. When power is turned on again, the defective bit address information, which is repair information retained in the eFuse macro 13, is written to the eFuse register 12. The address information stored in the eFuse register 12 is supplied to the DRAM I/F 14, and when data is written to the address, the data is written to the repair register in the DRAM I/O 15, which will be described later. Also, when data is read from the address of the defective bit, which is the repair target address, the data is read from this repair register.

Figure 3:
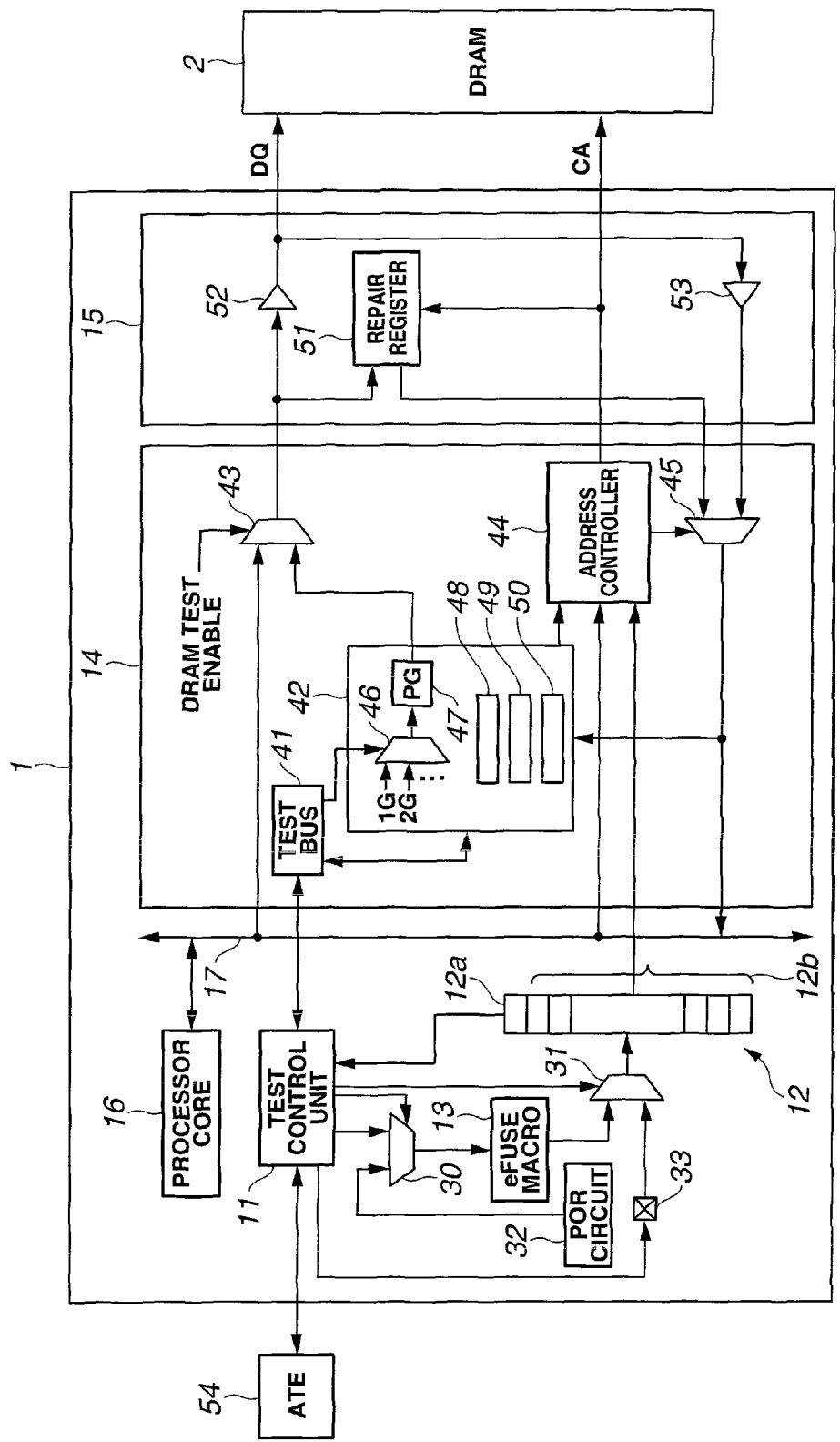
FIG. 3 is a detailed block diagram of the semiconductor device 1 in FIG. 2.

FIG. 3 is a detailed block diagram of the semiconductor device 1 in FIG. 2.

As illustrated in FIG. 3, the semiconductor device 1 includes a selector 30, a selector 31, a power-on reset (hereinafter referred to as "POR") circuit 32, and an eFuse terminal 33, in addition to the components in FIG. 2.

The DRAM I/F 14 includes a test bus 41, a BIST circuit 42, a selector 43, an address controller 44 and a selector 45. The BIST circuit 42 includes a selector 46, a pattern generator (hereinafter referred to as "PG") 47, a test result retaining section 48, and a repairability information retaining section 49, and an address information retaining section 50.

The DRAM I/O 15 includes a repair register 51, and buffer circuits 52 and 53.

During normal mode, when writing data to the DRAM 2, the processor core 16 supplies the data to be written to the selector 43 via the bus 17. The selector 43 is also supplied with data from the BIST circuit 42. The selector 43, based on a DRAM test enable, selects and outputs the data from the processor core 16 or the BIST circuit 42. When the DRAM test enable is inactive, the selector 43 selects the data from the processor core 16, and when the DRAM test enable is active, the selector 43 selects the data from BIST circuit 42. During normal mode in which the DRAM test enable is inactive, the selector 43 selects the data from the processor core 16. The data from the processor core 16, which has been selected by the selector 43, is supplied to the DRAM 2 via the buffer circuit 52.

Also, when writing data to the DRAM 2, the processor core 16 supplies the address of the data to be written, to the DRAM 2 via the address controller 44. Consequently, the processor core 16 can write the data to a desired address in the DRAM 2.

During normal mode, when reading data from the DRAM 2, the processor core 16 supplies a reading-target address to the DRAM 2 via the address controller 44. The DRAM 2 supplies data stored in the supplied address to the selector 45 via the buffer circuit 53. The selector 45 is also supplied with data from the repair register 51. The selector 45, based on a select signal from the address controller 44, selects and outputs the data from the DRAM 2 or the repair register 51. The data selected by the selector 45 is supplied to the processor core 16 via the bus 17. Consequently, the processor core 16 can read the data from a predetermined address in the DRAM 2.

Next, the DRAM 2 during test mode will be described. First, an instruction to perform a BIST of the DRAM 2 is output from the ATE 54 to the TCU 11. The TCU 11 outputs this instruction to the BIST circuit 42 via the test bus 41. Based on this instruction, the BIST circuit 42 performs a BIST of the DRAM 2.

Also, the TCU 11 outputs a selection signal for selecting test pattern data for the stacked DRAM 2 to the selector 46 via the test bus 41. The selector 46 is supplied with a plurality of test pattern data including, for example, test pattern data for a DRAM 2 with a capacity of 1 GB (gigabyte) or test pattern data for a DRAM 2 with a capacity of 2 GB. The selector 46 outputs the test pattern data selected based on the selection signal from the TCU 11, that is, test pattern data suitable for the stacked DRAM 2, to the PG 47.

The PG 47 generates a test pattern from the selected test pattern data, and outputs the generated test pattern to the selector 43. While a BIST is performed, the DRAM test enable is active, and the selector 43 selects a test pattern from the PG 47 in the BIST circuit 42. The test pattern selected by the selector 43 is supplied to the DRAM 2 via the buffer circuit 52.

Also, the BIST circuit 42 supplies an address for data writing and data reading while the BIST is performed to the DRAM 2 via the address controller 44. Consequently, the BIST circuit 42 performs writing and reading of data from and to a designated address in the DRAM 2.

The BIST circuit 42 sequentially switches the address from one to another to perform data reading and data writing for all the addresses in the DRAM 2. The data sequentially read from the DRAM 2 are supplied to the selector 45 via the buffer circuit 53. The selector 45 is supplied with a selection signal for selecting outputs of the buffer circuit 53 while a test is performed. Based on the selection signal from the address controller 44, the selector 45 selects the outputs from the buffer circuit 53, and sequentially outputs the selected data to the BIST circuit 42.

The BIST circuit 42 sequentially compares data sequentially input from the selector 45 and an expected value, and determines whether or not the respective data has passed the test. If the BIST circuit 42 determines that all the data have passed the test as a result of the sequential comparison, information indicating that the test has been passed, for example, "1", to the test result retaining section 48. Here, the BIST circuit 42 does not rewrite the data retained in the repairability information retaining section 49 and the address information retaining section 50, and leaves the data to be their initial values.

The respective pieces of information stored in the test result retaining section 48, the repairability information retaining section 49 and the address information retaining section 50 are output from the TCU 11 via the test bus 41. The TCU 11 outputs these pieces of information to the ATE 54, and the ATE 54 thereby determines that the test using a BIST has been passed.

Next, if the BIST circuit 42 determines that the test has been failed for a certain address as a result of the sequential comparison, the BIST circuit 42 stores information indicating that the test has been failed, for example, "0", in the test result retaining section 48. Furthermore, the BIST circuit 42 stores enable information indicating that the DRAM 2 can be repaired, for example, "1", in the repairability information retaining section 49, and stores information for the failed address, for example, "80", to the address information retaining section 50.

The respective pieces of information stored in the test result retaining section 48, the repairability information retaining section 49 and the address information retaining section 50 are output to the TCU 11 via the test bus 41. The TCU 11 outputs these pieces of information to the ATE 54, and the ATE 54 thereby determines that the DRAM 2 can be repaired. Also, as will be described later, if the DRAM 2 can be repaired, the TCU 11 performs blow processing to write the respective pieces of information stored in the repairability information retaining section 49 and the address information retaining section 50 to the eFuse macro 13.

Furthermore, where the semiconductor device 1 has a circuit configuration that can repair only one bit, if the BIST circuit 42 determines that the test has been failed for a certain address, "80", and then determines that the test has been failed for another address, for example, "83", the BIST circuit 42 stores enable information indicating that the DRAM 2 cannot be repaired, for example, "0", in the repairability information retaining section 49. Then, the BIST circuit 42 stores information for the other failed address, that is, "83", in the address information retaining section 50. In the test result retaining section 48, "0", which is the information indicating that the test has been failed, is still stored. In other words, the repairability information retaining section 49 stores "1" when the semiconductor device 1 can repair the defective bit.

The respective pieces of information stored in the test result retaining section 48, the repairability information retaining section 49 and the address information retaining section 50 are output to the TCU 11 via the test bus 41. The TCU 11 outputs these pieces of information to the ATE 54, and the ATE 54 thereby determines that the DRAM 2 cannot be repaired.

As described above, the BIST circuit 42 in the present embodiment determines that the DRAM 2 can be repaired where the DRAM 2 has a bit defect in one address, while the DRAM 2 cannot be repaired where the DRAM 2 has a bit defect in two or more addresses. As described above, the BIST circuit 42 constitutes a defective bit detection circuit configured to detect a defective bit in the DRAM 2 connected to the semiconductor device 1 and retrieve address information for the detected bit defect.

Also, while the present embodiment is configured to be able to repair the DRAM 2 where the DRAM 2 has one bit defect, that is, the DRAM 2 has a bit defect in one address, the present embodiment may also be configured to be able to repair the DRAM 2 where the DRAM 2 has two or more bit defects, that is, the DRAM 2 has a bit defect in two or more addresses.

For example, in order to provide a configuration that the DRAM 2 can be repaired where the DRAM 2 has a bit defect in two addresses, the address information retaining section 50 is configured to retain information for two failed addresses. The repairability information retaining section 49 stores enable information indicating that the DRAM 2 can be repaired until the number of addresses having a bit defect reaches two, and stores enable information indicating that the DRAM 2 cannot be repaired when the number of addresses having a bit defect has reached three. Furthermore, two eFuse registers 12 are provided: one of the eFuse registers 12 stores the first address having a bit defect, and the other eFuse register 12 stores the second address having a bit defect.

As described above, the DRAM 2 can be repaired even where the DRAM 2 has a bit defect in two or more addresses.

Here, the blow processing to write the respective pieces of information stored in the repairability information retaining section 49 and the address information retaining section 50 to the eFuse macro 13 will be described. It is assumed that the repairability information retaining section 49 stores "1", which indicates enable information indicating the DRAM 2 can be repaired, and the address information retaining section 50 stores "80" as address information for a failed address. Also, the eFuse macro 13 may have a capacity that can store, for example, repair information for a memory (not illustrated) in the semiconductor device 1 or repair information for the semiconductor chip 3 in addition to the repair information for the DRAM 2.

The TCU 11 determines whether or not the DRAM 2 can be repaired from the information stored in the repairability information retaining section 49 from among the respective pieces of information stored in the test result retaining section 48, the repairability information retaining section 49 and the address information retaining section 50. In other words, the TCU 11 determines that the DRAM 2 can be repaired if "1" is stored in the repairability information retaining section 49. Upon determining that the DRAM 2 can be repaired, the TCU 11 blows "1" stored in the repairability information retaining section 49, which indicates enable information indicating that the DRAM 2 can be repaired, and "80" stored in the address information retaining section 50, which indicates address information indicating the failed address, into the eFuse macro 13. In other words, the TCU 11 records these pieces of information into the eFuse macro 13 in terms of hardware. Consequently, the pieces of information recorded and thereby stored in the eFuse macro 13 are retained in the eFuse macro 13 even when the power of the semiconductor device 1 is turned off. Here, the TCU 11 outputs the enable information indicating that the DRAM 2 can be repaired and the address information for the failed address to the selector 30, while outputting a selection signal for selecting these outputs to the selector 30. As a result, as described above, the TCU 11 can blow the enable information and the address information into the eFuse macro 13.

Next, a BIST using the enable information and the address information retained in the eFuse macro 13 as described above will be described. If a test for determining whether or not the enable information and the address information have correctly been blown during the above blow processing being performed is performed, a BIST using the enable information and the address information, which will be described below, may be omitted. This is because, if the enable information and the address information have correctly been blown, no defect will occur in the below-described BIST. Consequently, a BIST after the blow processing can be omitted, thereby reducing the test time.

The eFuse macro 13 outputs the blown enable information and address information to the selector 31. The selector 31 is supplied with a selection signal from the TCU 11. In particular, where the TCU 11 performs a BIST, the TCU 11 outputs a selection signal for selecting outputs of the eFuse macro 13 to the selector 31. Based on this selection signal, the selector 31 selects the outputs of the eFuse macro 13, and outputs them to the eFuse register 12.

The eFuse register 12 includes a 32-bit storage section, and the 32-bit storage section includes a one-bit repairability information storing section 12a, and a 31-bit address information storing section 12b. The eFuse register 12 constitutes a volatile defect information retaining circuit. "1", which indicates enable information indicating that the DRAM 2 can be repaired, from among the outputs of the eFuse macro 13, is stored in the repairability information storing section 12a, and "80", which indicates address information for the failed address is stored in the 31-bit address information storing section 12b. The eFuse register 12 outputs the information stored in the repairability information storing section 12a and the address information storing section 12b to the address controller 44.

Although the address information storing section 12b has been described as having a bit count of 31, the bit count will not be limited to 31, and another number may be employed. In the present embodiment, description will be provided assuming that the address information storing section 12b has a bit count of 31 so that where the capacity of the DRAM 2 stacked on the semiconductor device 1 is 4 GB, the address information storing section 12b can express all the addresses in the 4-GB DRAM 2. Consequently, the bit count for the address information storing section 12b may be changed according to the capacity of the DRAM 2 stacked on the semiconductor device 1.

Next, a signal to issue an instruction to perform a BIST is output from the TCU 11 to the BIST circuit 42. Consequently, the above-described BIST is performed. In other words, a test pattern is output from the PG 47 to the selector 43, and address information for data writing or data reading is output from the BIST circuit 42 to the address controller 44. If the address information output from the BIST circuit 42 is other than "80", the processing will be similar to that in the above-described BIST, and thus, description of the processing will be omitted.

First, when data is written, address information for data writing is output from the BIST circuit 42 to the address controller 44. Also, the address controller 44 is supplied with the address information stored in the address information storing section 12b, which indicates the address of the defective bit.

The address controller 44 compares the address information stored in the address information storing section 12b, which indicates the address of the defective bit, and the address information from the BIST circuit 42. When these pieces of address information correspond to each other, the address controller 44 outputs a control signal and the address information for data writing to the repair register 51. In the present embodiment, when "80" is output from the BIST circuit 42 to the address controller 44 as address information, the address controller 44 outputs a control signal and the address information for data writing to the repair register 51.

The repair register 51 is supplied with a test pattern from the PG 47 via the selector 43. Based on the control signal and the address information for data writing from the address controller 44, the repair register 51 stores data for this test pattern.

Meanwhile, when data is read, address information for data reading is output from the BIST circuit 42 to the address controller 44. The address controller 44 compares the address information for data reading from the BIST circuit 42 and the address information from the address information storing section 12b in the eFuse register 12. When these pieces of address information correspond to each other, that is, when "80" is output from the BIST circuit 42 as address information, the address controller 44 outputs a control signal and the address information for data reading to the repair register 51.

Based on the control signal and the address information for data reading from the address controller 44, the repair register 51 reads stored data and outputs the read data to the selector 45. The repair register 51 constitutes a defective bit storage circuit configured to store data for the address of a defective bit.

As described above, the address controller 44 compares the address information stored in the information storing section 12b, which indicates the address of the defective bit, and the address information from the BIST circuit 42, and when these pieces of information correspond to each other as a result of the comparison, the address controller 44 performs the processing to write data to the repair register 51 or read data from the repair register 51. The address controller 44 constitutes a control section configured to control using the repair register 51 during writing and reading to and from the address of a defective bit.

Also, when the address information from the address information storing section 12b and the address information for data reading correspond to each other as a result of the comparison, the address controller 44 outputs a selection signal for selecting data from the repair register 51 to the selector 45. Based on this selection signal, the selector 45 selects data from the repair register 51, and outputs the selected data to the BIST circuit 42. The BIST circuit 42 compares the data from the repair register 51 and an expected value to confirm whether or not the BIST has been passed.

Figure 4:
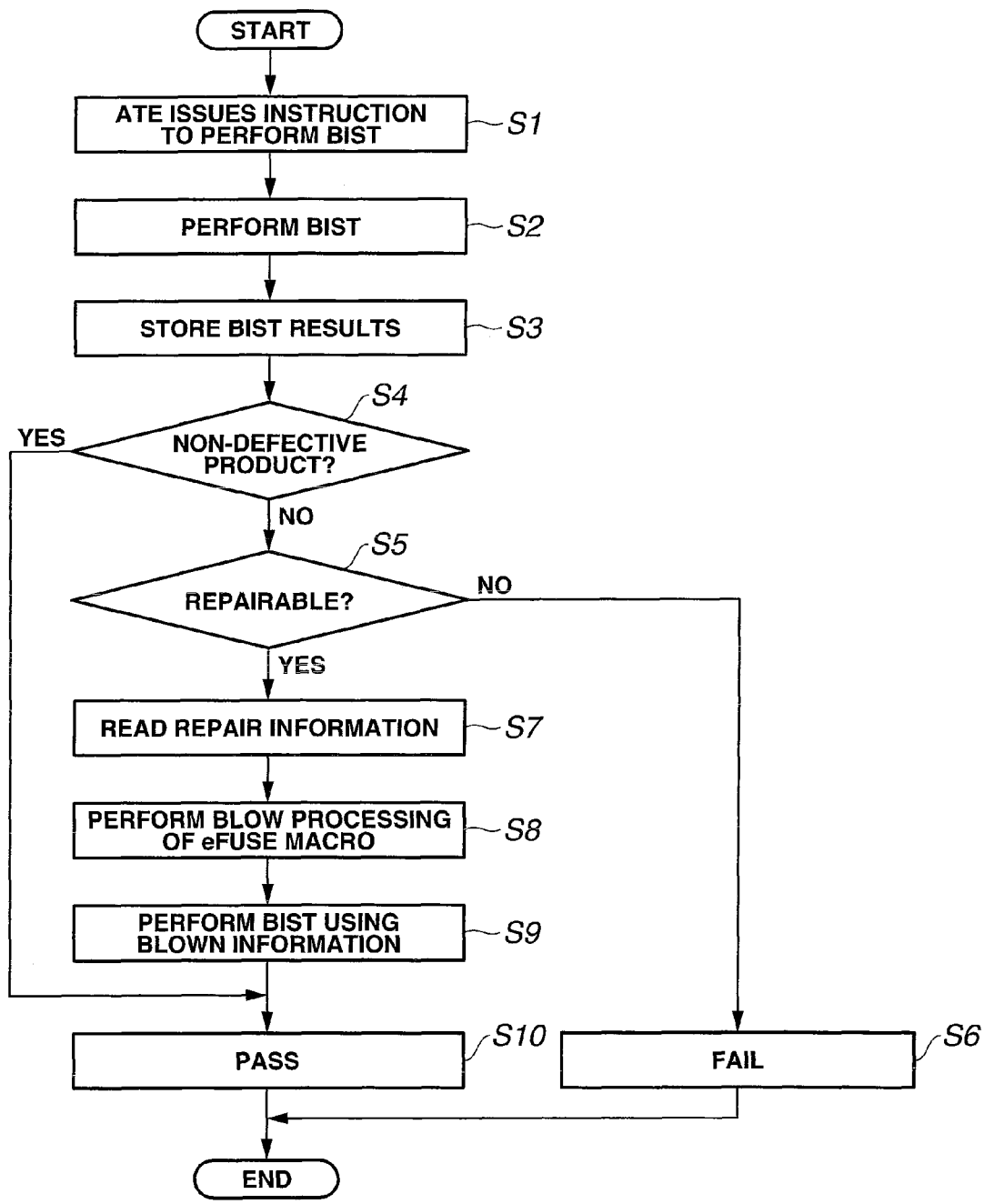
FIG. 4 is a flowchart illustrating an example of the flow of processing to repair a DRAM 2.

Here, the processing to repair the DRAM 2, which is performed as described above, will be described. FIG. 4 is a flowchart illustrating an example of the flow of processing to repair the DRAM 2.

First, an instruction to perform a BIST of the DRAM 2 is output from the ATE 54 to the TCU 11 (step S1). This instruction is supplied to the BIST circuit 42 via the test bus 41, thereby a BIST being performed (step S2). The respective results of the performance of the BIST are stored in the test result retaining section 48, the repairability information retaining section 49 and the address information retaining section 50 (step S3), and based on the information stored in the test result retaining section 48, whether or not the DRAM 2 is a non-defective product is determined (step S4). If the DRAM 2 is a non-defective product, the determination result is YES, and the processing proceeds to step S10, and a determination that the BIST has been passed is made. If the DRAM 2 is not a non-defective product, the determination result is NO, and whether or not the DRAM 2 can be repaired is determined based on the information stored in the repairability information retaining section 49 (step S5). If the DRAM 2 cannot be repaired, the determination result is NO, and a determination that the BIST has been failed is made (step S6). If the DRAM 2 can be repaired, the determination result is YES, and the repair information is read (step S7). Here, the repair information is the information stored in the repairability information retaining section 49 and the address information retaining section 50, respectively. Blow processing to blow the repair information into the eFuse macro 13 is performed (step S8). A BIST using the blown information is performed (step S9), and a determination that the BIST has been passed is made (step S10).

As described above, if it has been confirmed that repair information has correctly been blown in the blow processing at step S8, the processing at step S9 may be omitted. Consequently, a BIST after the blow processing can be omitted, thereby reducing the test time.

As a result of the above-described processing, the processing to store the repair information stored in the repairability information retaining section 49 and the address information retaining section 50, respectively, in the eFuse macro 13 is completed.

Next, an operation in normal mode after the repair information being blown in the eFuse macro 13 will be described.

When the power of the semiconductor device 1 is turned on, a signal indicating that the power is turned on is output from the POR circuit 32 to the selector 30. In the case of normal mode, the selector 30 is supplied with a selection signal for selecting the output of the POR circuit 32 from the TCU 11. Based on this selection signal, the selector 30 outputs a signal indicating that the power has been turned on, to the eFuse macro 13.

When this signal is input, the eFuse macro 13 writes the blown address information for the defective bit to the eFuse register 12 via the selector 31. The address information stored in the eFuse register 12 is output to the address controller 44.

During normal mode, the processor core 16 supplies an address for data writing or reading to the address controller 44 via the bus 17. When the address from the eFuse register 12 and the address for data writing correspond to each other, the address controller 44 performs the processing to write the data from the bus 17, which has been selected by the selector 43, to the repair register 51. Also, when the address from the eFuse register 12 and the address for data reading correspond to each other, the address controller 44 performs the processing to read the data stored in the repair register 51. The data read as described above is output to the bus 17 via the selector 45. As described above, when data is written to or read from an address having a bit defect in the DRAM 2, the processor core 16 performs writing or reading of the data to or from the repair register 51.

Before the above described blow processing for the eFuse circuit 13, it may be determined whether or not a defective bit in the DRAM 2 can be repaired using the repair information stored in the repairability information retaining section 49 and the address information retaining section 50. Once the repair information is blown into the eFuse macro 13, the content of the eFuse macro 13 cannot be changed. Thus, before blowing the repair information into the eFuse macro 13, it is determined whether or not a defective bit in the DRAM 2 can be repaired using the repair information, and after it has been determined that the defective bit can be repaired, the repair information is blown into the eFuse macro 13. Consequently, the defective bit in the DRAM 2 can reliably be repaired.

First, the TCU 11 outputs the repair information stored in the repairability information retaining section 49 and the address information retaining section 50 to the eFuse terminal 33. The eFuse terminal 33 outputs the repair information to the selector 31. Here, the TCU 11 outputs a selection signal for selecting the repair information from the eFuse terminal 33 to the selector 31. Based on this selection signal, the selector 31 outputs the repair information from the eFuse terminal 33 to the eFuse register 12.

Consequently, for example, "1" indicating enable information is stored in the repairability information storing section 12a, and "80" indicating the address information for the failed address is stored in the address information storing section 12b. Here, the above-described BIST is performed, thereby writing and reading of data when the address is "80" is performed using the repair register 51. If a defective bit in the DRAM 2 has been repaired as a result of the BIST, "1" indicating that the test has been passed is stored in the test result retaining section 48.

Upon determining that the test has been passed based on the information from the test result retaining section 48, the TCU 11 blows the repair information output to the eFuse terminal 33, into the eFuse macro 13. As a result, the defective bit in the DRAM 2 can reliably be repaired.

In the present embodiment, the DRAM I/O 15 and the DRAM 2 share the same power source. In order to reduce the power consumption, for example, the semiconductor device 1 may turn off the power supply of a large part of the semiconductor device 1 during sleep mode. In this case, in order to prevent the data retained in the DRAM 2 from being erased, power is supplied to the DRAM 2, and in order to prevent the data stored in the repair register 51, power is supplied also to the DRAM I/O 15. Here, if the power source of the DRAM I/O 15 is shared with another circuit in the semiconductor device 1, the data retained in the repair register 51 is erased during sleep mode. Accordingly, the DRAM I/O 15 and the DRAM 2 share the same power source to prevent unintended data erasure.

As described above, the semiconductor device 1 is provided with the BIST circuit 42 configured to perform a self-test of the stacked DRAM 2 to detect address information for a defective bit in the DRAM 2. The address information for the defective bit in the DRAM 2, which has been detected by the BIST circuit 42, is blown in the eFuse macro 13, and at the time of a power-on reset, output to the address controller 44. Upon receipt of an instruction to write or read data to or from the address of the defective bit, the address controller 44 controls performing the data writing or reading using the repair register 51. As a result, on writing or reading data to or from the address of the defective bit in the DRAM 2, the semiconductor device 1 uses the repair register 51, and thus, the defective bit can be repaired even though the stacked DRAM 2 includes no repair circuit.

Accordingly, the semiconductor device according to the present embodiment can easily repair a memory connected to the semiconductor device, whether or not the connected memory includes a repair circuit.

The steps in the flowchart in the present specification may be changed in the performance sequence, or a plurality of steps from among the steps may be performed simultaneously, or the steps may be performed in an order that differs depending on each performance, as long as such change or performance does not depart from the nature of the steps.

The present invention is not limited to the above-described embodiment, and various modifications, alterations or the like can be made as long as such modifications, alternations or the like do not depart from the spirit of the present invention.

What is claimed is:

1. A semiconductor device including a processor core, the semiconductor device comprising:
   a defective bit detection circuit configured to detect a defective bit in a memory connected to the semiconductor device, and retrieve an address of the detected defective bit;
   a non-volatile defect information retaining circuit configured to retain the address of the defective bit in the memory, the defective bit being detected by the defective bit detection circuit;
   a defective bit storage circuit configured to store data for the address of the defective bit; and
   a control section configured to, based on the address retained in the defect information retaining circuit, perform control to use the defective bit storage circuit during reading from and writing to the address of the defective bit.

2. The semiconductor device according to claim 1, wherein the defective bit detection circuit generates a test pattern corresponding to the memory connected to the semiconductor device.

3. The semiconductor device according to claim 1, further comprising
   a processing circuit configured to perform processing to write the address of the defective bit in the memory, the defective bit being detected by the defective bit detection circuit, to the non-volatile defect information retaining circuit.

4. The semiconductor device according to claim 1, further comprising
   a volatile defect information retaining circuit configured to retain the address of the defective bit in the memory, the defective bit being detected by the defective bit detection circuit.

5. The semiconductor device according to claim 1, wherein the defective bit storage circuit shares the same power source with the memory connected to the semiconductor device.

6. The semiconductor device according to claim 1, wherein the defective bit detection circuit includes: an address information retaining section configured to retain the address of the defective bit in the memory; and a repair information retaining section configured to retain information indicating whether or not the defective bit in the memory can be repaired.

7. The semiconductor device according to claim 6, wherein when the repair information retaining section retains information indicating that the defective bit in the memory can be repaired, the processing circuit performs processing to write the address of the defective bit in the memory to the non-volatile defect information retaining circuit.

8. The semiconductor device according to claim 3, further comprising
   a volatile defect information retaining circuit configured to retain the address of the defective bit in the memory, the defective bit being detected by the defective bit detection circuit.

9. The semiconductor device according to claim 8, wherein before performing the processing to write the address of the defective bit in the memory, the defective bit being detected by the defective bit detection circuit, to the non-volatile defect information retaining circuit, the processing circuit determines whether or not the defective bit in the memory can be repaired using the address of the defective bit in the memory, the address retained by the volatile defect information retaining circuit.

10. A semiconductor package formed by enclosing a semiconductor device including a processor core and a memory stacked on the semiconductor device in a single package, the semiconductor device comprising:
    a defective bit detection circuit configured to detect a defective bit in the stacked memory, and retrieve an address of the detected defective bit;
    a non-volatile defect information retaining circuit configured to retain the address of the defective bit in the memory, the defective bit being detected by the defective bit detection circuit;
    a defective bit storage circuit configured to store data for the address of the defective bit; and
    a control section configured to, based on the address retained in the defect information retaining circuit, perform control to use the defective bit storage circuit during reading from and writing to the address of the defective bit.

11. The semiconductor package according to claim 10, wherein the defective bit detection circuit generates a test pattern corresponding to the memory stacked on the semiconductor device.

12. The semiconductor package according to claim 10, further comprising
    a processing circuit configured to perform processing to write the address of the defective bit in the memory, the defective bit being detected by the defective bit detection circuit, to the non-volatile defect information retaining circuit.

13. The semiconductor package according to claim 10, further comprising
    a volatile defect information retaining circuit configured to retain the address of the defective bit in the memory, the defective bit being detected by the defective bit detection circuit.

14. The semiconductor package according to claim 10, wherein the defective bit storage circuit shares the same power source with the memory stacked on the semiconductor device.

15. A memory repair method for a memory connected to a semiconductor device including a processor core, the method comprising:
    detecting a defective bit in the memory connected to the semiconductor device, and acquiring an address of the detected defective bit by the semiconductor device;
    retaining the address of the detected defective bit in the memory, in a non-volatile defect information retaining circuit by the semiconductor device;
    storing data for the address of the defective bit in a defective bit storage circuit by the semiconductor device; and
    based on the address retained in the defect information retaining circuit, performing control to use the defective bit storage circuit during reading from and writing to the address of the defective bit by the semiconductor device.

16. The memory repair method according to claim 15, further comprising
    when detecting the defective bit in the memory connected to the semiconductor device, generating a test pattern corresponding to the memory connected to the semiconductor device.

17. The memory repair method according to claim 15, further comprising retaining the address of the detected defective bit in the memory, in a volatile defect information retaining circuit.

18. The memory repair method according to claim 17, further comprising
  determining whether or not the defective bit in the memory can be repaired using the address of the defective bit in the memory retained in the volatile defect information retaining circuit.

19. The memory repair method according to claim 18, further comprising
  when it is determined that the defective bit in the memory can be repaired, performing processing to write the address of the detected defective bit in the memory to the non-volatile defect information retaining circuit.

20. The memory repair method according to claim 19, further comprising
  performing a BIST using the address of the defective bit written in the non-volatile defect information retaining circuit to confirm that the defective bit in the memory has been repaired.

* * * * *